(12) United States Patent
Yatsugi et al.

(10) Patent No.: US 10,251,271 B2
(45) Date of Patent: Apr. 2, 2019

(54) ELECTRONIC CONTROL DEVICE

(71) Applicant: HITACHI AUTOMOTIVE SYSTEMS, LTD., Hitachinaka-shi, Ibaraki (JP)

(72) Inventors: Tomishige Yatsugi, Hitachinaka (JP); Masao Fujimoto, Isesaki (JP)

(73) Assignee: HITACHI AUTOMOTIVE SYSTEMS, LTD., Hitachinaka-Shi (JP)

( * ) Notice: Subject to any disclaimer, the term of this patent is extended or adjusted under 35 U.S.C. 154(b) by 99 days.

(21) Appl. No.: 15/542,916

(22) PCT Filed: Sep. 9, 2015

(86) PCT No.: PCT/JP2015/075538
§ 371 (c)(1),
(2) Date: Jul. 11, 2017

(87) PCT Pub. No.: WO2016/113945
PCT Pub. Date: Jul. 21, 2016

(65) Prior Publication Data
US 2018/0007787 A1    Jan. 4, 2018

(30) Foreign Application Priority Data
Jan. 13, 2015    (JP) .................. 2015-003764

(51) Int. Cl.
*H05K 1/11* (2006.01)
*H05K 1/05* (2006.01)

(52) U.S. Cl.
CPC .............. *H05K 1/116* (2013.01); *H05K 1/05* (2013.01)

(58) Field of Classification Search
USPC ........................................................ 174/557
See application file for complete search history.

(56) References Cited

U.S. PATENT DOCUMENTS

| 8,263,875 B2 | 9/2012 | Nodo et al. |
| 2008/0066955 A1 | 3/2008 | Nodo et al. |
| 2012/0255767 A1 | 10/2012 | Toratani et al. |

FOREIGN PATENT DOCUMENTS

| JP | 2008-072065 A | 3/2008 | |
| JP | 2008072065 A | * 3/2008 | ............ H05K 1/111 |

(Continued)

OTHER PUBLICATIONS

International Search Report and Written Opinion issued in parent application PCT/JP2015/075538, dated Nov. 2, 2015, 7 pages.

*Primary Examiner* — William H Mayo, III
*Assistant Examiner* — Krystal Robinson
(74) *Attorney, Agent, or Firm* — Foley & Lardner LLP

(57) ABSTRACT

A stress mitigation region is formed in which a predetermined number of stress mitigation holes penetrating through a wiring are disposed is formed in a proximity of a bonding portion of an electronic component via which the electronic component is bonded to the wiring with an electrically conductive bonding agent. Accordingly, even if a stress is generated in the wiring due to a heat, the stress mitigation holes are deformed so that the stress acted upon the electrically conductive bonding agent becomes small and a generation of cracks in the electrically conductive bonding agent can be suppressed. In addition, the stress mitigation holes are made circular so that concentrations of a current and the stress can be reduced and the generation of the cracks in the wiring can be suppressed.

11 Claims, 4 Drawing Sheets

(56) References Cited

FOREIGN PATENT DOCUMENTS

| JP | 2011-151368 A | | 8/2011 |
|---|---|---|---|
| JP | 2011151368 A | * | 8/2011 |

* cited by examiner

ELECTRONIC CONTROL DEVICE

TECHNICAL FIELD

The present invention relates to an electronic control device and especially relates to an electronic control device in which an electronic component is surface mounted on a metal substrate.

BACKGROUND ART

In an electronic circuit in which surface mounting type electronic components are mounted, the electronic component such as a chip resistor, a chip capacitor, or so forth is mounted exceeding over (straddling between) a plurality of electrical wirings. Hence, it is important to improve a reliability on the mounting by increasing a durability of an electrically conductive bonding agent such as a solder, a conductive resin, or so forth used in a bonding of the chip resistor or the chip capacitor to each electrical wiring. Especially, when the chip capacitor or the chip resistor is mounted on the metal substrate having a large thermal expansion rate, it is important to improve the reliability on the mounting.

Recently, in order to realize the surface mounting which enables a miniaturization and a labor saving during the mounting, various types of circuit boards are used and electronic circuits in which various types of surface mounting electronic components are mounted on such circuit boards as described above have been used. Especially, as the circuit boards on which electronic components having high heat generating characteristics are mounted, such metal substrates that insulation layers on which insulating materials such as epoxy resins or so forth are coated are disposed on the metal substrates and copper foil circuit patterns are disposed on these insulation layers have been used.

Incidentally, such an industrial demand has strongly been made that vehicle-mounted electronic equipment is to be installed within an engine compartment as well as the equipment to be miniaturized and to be saved in space. Since the internal combustion engine is housed within the engine compartment, such a cruel environment that a temperature is high and a temperature variation is large is present. Hence, such circuit boards as being superior in a hear dissipation characteristic and as being high in a long-term reliability are required.

In circuits on the metal substrates, various kinds of electronic components are bonded via electrically conductive bonding agents such as solders, electrically conductive resins, or so forth. However, when a repetition of a temperature rise and a temperature fall in an actual use (=a heat cycle) is received over a long term, cracks in the electronically conductive bonding agents themselves or in bonding portions between the electrically conductive bonding agents and the wirings are often generated. Consequently, electrical bonding between chip resistors or chip capacitor electrodes are lost or such a problem that thermal conduction routes generated from components are interrupted is generated.

Especially, due to a thermal (heat) dissipation characteristic or an economical reason, there are many cases where aluminum plates are used as the metal substrates. It should be noted that, depending upon the situation, copper plates are sometimes used as the metal substrates. However, since a difference in a thermal expansion rate between the metal substrates and the electronic components, especially, between the metal substrates and ceramic components such as chip resistors and chip capacitors is large, the above-described problem becomes especially easy to be generated.

In order to solve the problem such that the cracks are generated in the electrically conductive bonding agents themselves such as solders or electrically conductive resins, or so forth for fixing the electronic components or in the bonding portions between the electrically conductive portions and between the electrically conductive bonding agents and the wirings, for example, in a Japanese Patent Application Publication No. 2008-072065 (Patent Document 1), such a surface mounting structure that the structure comprises: a surface mounting purpose electronic component having electrodes on both end sections of the electronic component in an elongate direction; a land connected to one of the electrodes via a solder; a wiring having a width of a side to which the wiring is connected shorter than a length of the surface mounting electronic component in a shorter direction; and a solid pattern having a width of a side to which the wiring is connected longer than a length of the surface mounting purpose electronic component has been proposed.

According to this Patent Document 1, since the surface mounting substrate is a structure in which the solid pattern is connected to the land using the wiring having a shorter width than the surface mounting purpose electronic component or the solid pattern, a stress applied to the solder(s) due to an expansion or contraction of each member such as the surface mounting electronic component and the solid pattern can be absorbed in the wiring whose width is short and the generation of the cracks due to the thermal stress on the solder(s) can be suppressed.

PRE-PUBLISHED DOCUMENT

Patent Document 1: a Japanese Patent Application Laid-open Publication No. 2008-072065.

DISCLOSURE OF THE INVENTION

Incidentally, the wirings are made thin in order not to generate the cracks in the solders due to the thermal stress on the solders, in Patent Document 1. In some cases, the wirings cannot be made thin. For example, such electronic components as chip capacitors are, in many cases, disposed to straddle between a power supply wiring and a ground wiring and it is necessary to make widths of wirings bold and pull out them. Therefore, the thinning of the wirings cannot correspond to this situation. Hence, a strong demand such that the thermal stress is reduced even in the bold wirings to suppress the generation of the cracks in the electrically conductive bonding agents themselves or bonding portions between the electrically conductive boding agents and the wirings has been made.

It is an object of the present invention to provide an electronic control device having a novel wiring structure in which cracks are difficult to be generated even when a thermal stress from a wiring is acted upon an electrically conductive bonding agent in a case where the electronic component is bonded to a bold wiring with the electrically conductive bonding agent.

A feature of the present invention is such that a stress mitigation region in which a predetermined number of stress mitigation holes penetrating through a wiring is formed in the proximity of a bonding portion of the electronic component via which the electronic component is bonded to the wiring with the electrically conductive bonding agent.

According to the present invention, even if the thermal stress is generated in the wiring (due to the heat), the stress mitigation holes are deformed so that the stress acted upon the electrically conductive bonding agent becomes reduced and the generation of cracks in the electrically conductive bonding agent can be suppressed.

EMBODIMENT FOR CARRYING OUT THE INVENTION

Hereinafter, the detailed description will be made with reference to the accompanied drawings in preferred embodiments according to the present invention. Various modifications and application examples are included in a scope of the present invention without a limitation of the present invention to the preferred embodiments described hereinafter.

Figure 1:
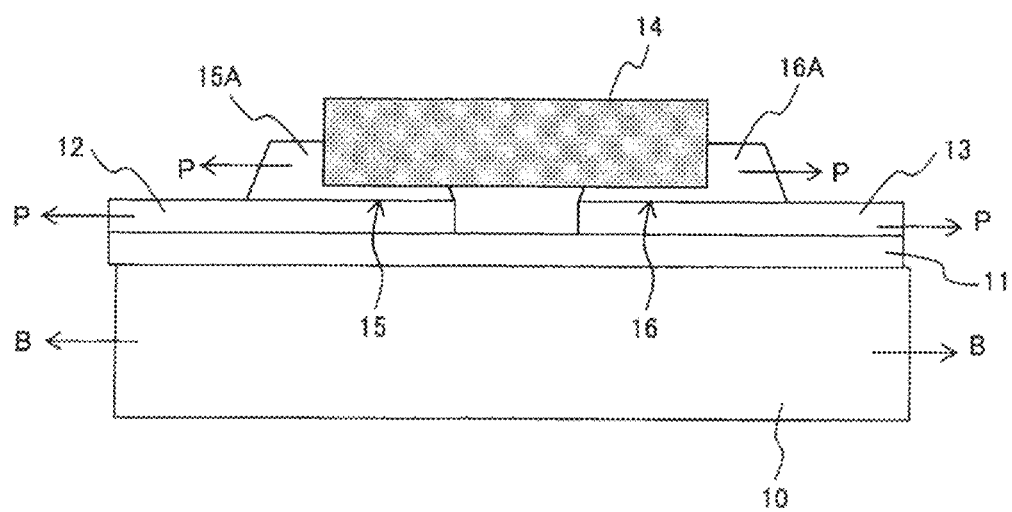
FIG. 1 shows a cross sectional view representing a cross section of a wiring portion to which the wiring is bonded, with an electronic component mounted on the metal substrate.

FIG. 1 shows a mounting state in which a chip capacitor is mounted on a metal substrate and is connected to each of wirings straddling between the wirings. In a case where the chip capacitor is used, there are many cases where the chip capacitor is arranged to straddle between a power supply wiring and a ground wiring. Thus, a width of each of the wirings is made bold and each of the wirings is pulled out.

In FIG. 1, metal substrate 10 is made of aluminum and an insulation coating layer 11 is formed on an upper part of metal substrate 10. A wiring pattern having a copper foil is formed on an upper part of insulation coating layer 11. In FIG. 1, a first wiring 12 (a power supply side) and a second wiring 13 (a ground side) are formed. First wiring 12 and second wiring 13 are electrically connected together via chip capacitor 14. First wiring 12 is bonded at a first land section 15 via a solder 15A to one of electrodes of chip capacitor 14 and second wiring 13 is bonded at a second land section 16 via a solder 16A to the other electrode of chip capacitor 14.

Then, a current is caused to flow into chip capacitor 14 from, for example, first wiring 12 to chip capacitor 14 via first land section 15 and the current is caused to flow out from chip capacitor 14 to second wiring 13 via second land section 16. Since such a kind of structure as described above is well known, a more detailed explanation will herein be omitted.

In such a wiring structure as described above, as shown in FIG. 8, conventionally first land section 15 and second land section 16 are formed on a center section of an end surface E1 of first wiring 12 and on a center section of an end surface E2 of second wiring 13. Then, chip capacitor 14 is bonded to first land section 15 and second land section 16 straddling between first wiring 12 and second wiring 13. Each of first and second wirings 12, 13 is a solid wiring made of copper foil.

Figure 8:
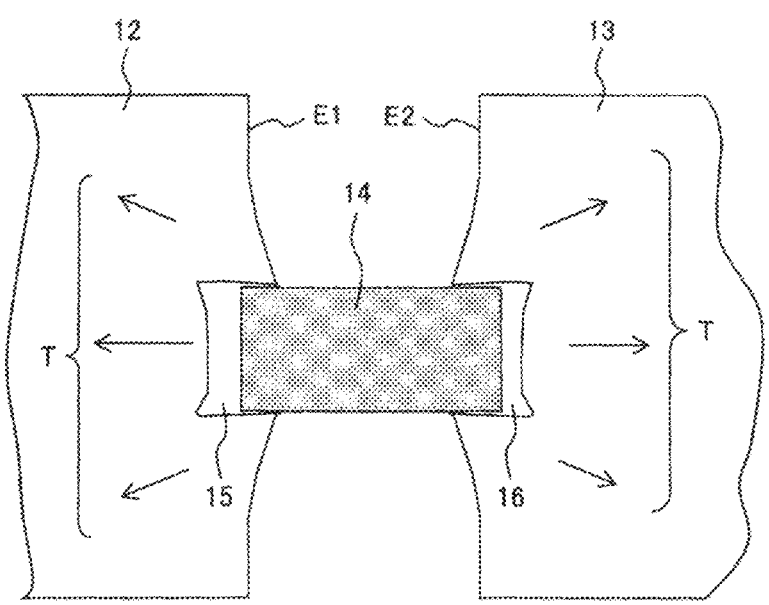
FIG. 8 shows an upper surface view of the wiring portion to which the wiring is bonded, with the electronic component mounted on the metal substrate, carried out in a conventional art.

In such a conventional wiring structure as described above, as shown in FIGS. 1 and 8, as the temperature becomes higher, metal substrate 10 is expanded in a direction of an arrowed mark B. Accordingly, first wiring 12 and second wiring 13 and solder 15A of land section 15 mounted thereon and solder 16A of land section 16 are displaced in a direction of arrowed mark P. On the other hand, since chip capacitor 14 is a ceramic component and a degree of expansion is lower than metal substrate 10. Hence, as shown in FIG. 8, a stress T (a tensile force) of contraction is lower than metal substrate 10. Hence, first wiring 12 and second wiring 13 generate the stress (a compression force) such that first wiring 12 and second wiring 13 are pushed against each other.

On the contrary, when the temperature becomes lower, metal substrate 10 is contracted in a direction opposite to the direction of arrowed mark B. Accordingly, first and second wirings 12, 13, solder 15A of land section 15, and solder 16A of land section 16 are displaced in the direction opposite to the direction of arrowed mark P. On the other hand, since chip capacitor 14 is a ceramic component, a degree of expansion is lower than metal substrate 10. Hence, as shown in FIG. 8, a stress T (tensile force) of contraction is lower than metal substrate 10. Hence, first wiring 12 and second wiring 13 generate the stress (a compression force) such that first wiring 12 and second wiring 13 are pushed against each other.

Hence, when a repetitive stress is acted between solder 15A of land section 16, and chip capacitor 14 so that there is a possibility of generating cracks in solders 15A, 16A. Consequently, such a problem that an electrical bonding between the chip capacitor or the chip resistor electrodes and the board wiring is lost or thermal conduction routes generated from electronic components are interrupted is raised.

Then, in order to solve such a problem as described above, a stress mitigation region having a predetermined number of stress mitigation holes is formed in a wiring region which is in the proximity of a bonding portion of one electronic component to a wiring with an electrically conductive bonding agent. Accordingly, even if the stress is generated due to the heat, the stress mitigation holes are deformed and the stress acted upon the electrically conductive bonding agent becomes small so that the cracks or so forth to be generated in the electrically conductive bonding agent of a corresponding one electronic component can be suppressed.

Hereinafter, the preferred embodiments according to the present invention will be described in great details. Reference numerals which are the same as the reference numerals described in FIG. 1 designate the like constituent components.

Embodiment 1

Figure 2:
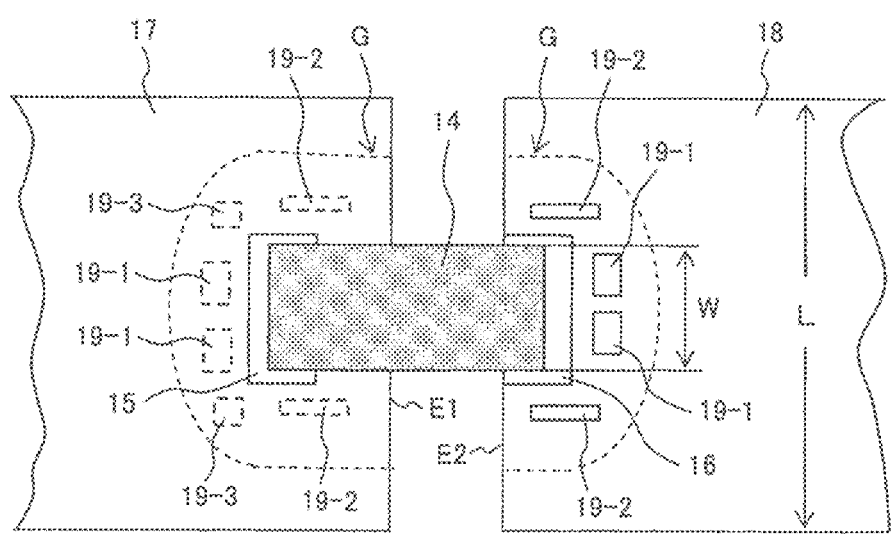
FIG. 2 shows an upper surface view of the wiring portion to which the wiring is bonded, with the electronic component mounted on a metal substrate, in a first preferred embodiment according to the present invention.

FIG. 2 shows an upper surface view representing a wiring structure in a first preferred embodiment according to the present invention, a feature being such that a stress mitigation region having a predetermined number of stress mitigation holes are formed in a surrounding of a land section.

In FIGS. 1 and 2, a wiring pattern made of copper foil is formed on an upper part of insulation coating layer 11 of metal substrate 10. In this embodiment, a first wiring 17 (a power supply side) and a second wiring 18 (a ground side) are formed. Chip capacitor 14 serves to electrically interconnect between first wiring 17 and second wiring 18. Solder 15A serves to bond, at first land section 15, first wiring 17 and one of electrodes of chip capacitor 14 and solder 16A serves to bond, at second land section 16, second wiring 13 and the other electrode of chip capacitor 14.

In addition, a width L of each wiring 17, 18 is twice or more larger than width W of chip capacitor 14. A first land section 15 and a second land section 16 are formed at a center section of an end surface E1, E2 of each of first and second wirings 17, 18. Solders 15A, 16A are arranged on these land sections 15, 16.

A predetermined number of stress mitigation holes 19-1, 19-2 are formed in one of stress mitigation regions G which is placed in the proximity of second land section 16 of second wiring 18. A total of four of two approximately square shaped rectangular stress mitigation holes 19-1 and two elongated rectangular stress mitigation holes 19-2 are formed in stress mitigation region G and are arranged to enclose second land section 16 in a range of stress mitigation region G. In addition, second land section 16 is arranged in the proximity of (flush with) end surface E2 of second wiring 18.

In such a structure as described above, for example, tensile stress T as shown in FIG. 8 is acted upon second land section 16 when the temperature becomes high. At this time, stress mitigation holes 19-1, 19-2 are deformed along the direction of tensile stress T. When stress mitigation holes 19-1, 19-2 are deformed, the tensile stress acted upon second land section 16 is reduced. Hence, a large tensile stress T is not acted upon solder 16A of second land section 16. A progress quantity of the cracks generated in solder 16A due to the heat cycle can be reduced.

In addition, in the same way, a case where a compression stress is generated with the temperature reduced occurs. Stress mitigation holes 19-1, 19-2 are deformed along a compression direction. Thus, the progress quantity of the cracks generated in solder 16A can be reduced. Hence, even if the tensile stress and compressive stress are repeated due to the heat cycle and are acted upon second land section 16, the stress can be reduced. As compared with the conventional case shown in FIG. 8, the degree of generating the cracks can remarkably be reduced.

A size of stress mitigation holes 19-1 is determined for at least one or more stress mitigation holes 19-1 to be positioned within a range of width W within stress mitigation region G of a line extending width W of chip capacitor 14. Thus, a stress of a position which corresponds to width W of chip capacitor 14 can efficiently be reduced. In this embodiment, two stress mitigation holes 19-1 are provided.

In addition, as shown in FIG. 2, since end surface E2 side of wiring 18 at second land section 16 of a location on which one terminal section of chip capacitor 14 is mounted has solder 16A having a thin thickness, the corner section of solder 16A at end surface E2 side of wiring 18 becomes easy for the cracks to be generated. Hence, elongated stress mitigation holes 19-2 are respectively formed at side surfaces of chip capacitor 14. Thus, elongated stress mitigation holes 19-2 are respectively formed at side surfaces of chip capacitor 14. Thus, the stress acted upon the side surfaces of chip capacitor 14 is reduced so that the progress quantity of the cracks generated in solder 16A can be reduced.

Furthermore, there is a tendency that the stress becomes easy to be concentrated onto corner sections of end surface sides of a fillet of solder 16A at an opposite side to end surface E2 of wiring 18. Hence, in this embodiment, stress mitigation holes 19-2 are positioned at locations which are near to (in the proximity of) these corner sections.

It should be noted that it is necessary for stress mitigation region G to be placed in the proximity of second land section 16. If a certain distance from stress mitigation region G to second land section 16 is provided, the stress generated in the wiring placed between second land section 16 and stress mitigation region G is acted upon solder 16A of second land section 16 without reduction of the stress. Hence, in this embodiment, a sufficient stress mitigation effect can be obtained when a distance from the end surface of second land section 16 to a center of each stress mitigation hole 19-1, 19-2 is shorter than a width W of a line to which width W of chip capacitor 14 is extended within stress mitigation region G. In summary, stress mitigation holes 19-1, 19-2 may be arranged at positions at which the stress acted upon solder 16A can be allowed in terms of design.

In the above-described first embodiment, stress mitigation region G is formed in second wiring 18 of second land section 16 side. It goes without saying that, as shown in dot lines of FIG. 2, stress mitigation region G may be formed in first wiring 17 at first land section 15 side. It should be noted that, in a case where the position at which the land section is formed is not placed at the position as in second land section 16, the arranged position of the stress mitigation holes is different. In a case where, as appreciated from the case of first land section 15 in FIG. 2, the land section is positioned at a more depth side than end surface E1 of first wiring 17, a certain distance between first land section 15 and end surface E1 of first wiring 17 is provided, end surface corner sections at end surface side E1 of first land section 15 are consequently positioned at this portion. Hence, the stress is concentrated onto this portion.

Therefore, in this embodiment, each stress mitigation holes 19-2 is brought near to end surface E1 side of first wiring 17. If stress mitigation holes 19-2 are made long, stress mitigation holes 19-2 can approach to the end surface corner section of first land section 15. If the lengths of these holes 19-2 are made longer than their necessities, an area of current flow in first wiring 17 becomes small and, accordingly, such a problem that a resistance and an inductance become high (large) is raised.

Hence, without modification of shapes of stress mitigation holes 19-2, stress mitigation holes 19-2 are made near to end surface corner sections at end surface side E1 of first land section 15.

On the other hand, if stress mitigation holes 19-2 are made near to the end surface corner sections of end surface E1 side of first land section 15, the end surface corner section which is opposite side to end surface E1 side of chip capacitor 14 and the stress mitigation hole corresponding to the end surface E1 side of the fillet of solder 15A of first land section 15 is eliminated, new stress mitigation holes 19-3 are formed. Stress mitigation holes 19-3 are arranged at positions corresponding to end surface corner sections which are opposite side to the end surface corner section of chip capacitor 14 and end surface E1 side of solder 15A of first land section 15.

In this way, according to the first embodiment, the stress mitigation region in which predetermined number of stress mitigation holes penetrating through the wiring are provided is formed in the proximity of the bonding section bonded to the wiring via the solder is formed.

Accordingly, even if the stress is generated on the wiring due to the heat, the stress acted upon the electrically conductive bonding agent becomes small due to the deformation of the stress mitigation holes so that the generation of the cracks in the electrically conductive agent(s) of the electronic component (electronic components) can be suppressed It should be noted that the concentration of stress can be reduced by providing appropriate arcs or chamfering sections of the corner sections of stress mitigation holes 19-1~19-2. Thus, the possibility of generation of the cracks or so forth is furthermore lowered and the reliability of the circuit board (substrate) with respect to the heat cycle can be reduced.

Embodiment 2

Next, the wiring structure in a second preferred embodiment according to the present invention will be explained. This embodiment is the same as the first embodiment in that the predetermined number of stress mitigation holes are formed in the surrounding of the respective land sections. However, although the stress mitigation holes in the first embodiment are rectangular, in the second embodiment, all of the stress mitigation holes are wholly arc shaped. This is a difference point from the first embodiment and makes this difference point a feature of the second embodiment. It should be noted that the same reference numerals as those described in the first embodiment are the same structural components (like corresponding elements).

Although the predetermined number of stress mitigation holes are formed in the surrounding of each of the land sections in the first embodiment, the shapes thereof are rectangular. Hence, many corner sections are formed within the wiring according to the stress mitigation holes penetrating through the wiring. Hence, a great number of the concentrations of currents flowing through the wirings are generated and the inductances due to the wirings which are parts of circuitry are increased. Thus, an effect of the widths of wirings is reduced. Especially, in a case where the chip capacitors are used, the purpose of providing the chip capacitors is to reduce impedances between the wirings and to be required to reduce the influence of increasing the inductances.

In addition, the wirings repeat expansions and contractions corresponding to the expansions and contractions of the metal substrate. Thus, the stresses are concentrated onto the corner sections of rectangular stress mitigation holes. When the heat cycle over the long term is applied, the corner sections are cracked. Consequently, the resistances are increased due to the reduction in passage areas of currents. In a worst case, such a phenomenon that the wirings are broken occurs.

Thus, in the third embodiment, stress mitigation holes as will be described hereinbelow are formed in the related wirings in order to solve the above-described problem.

Figure 3:
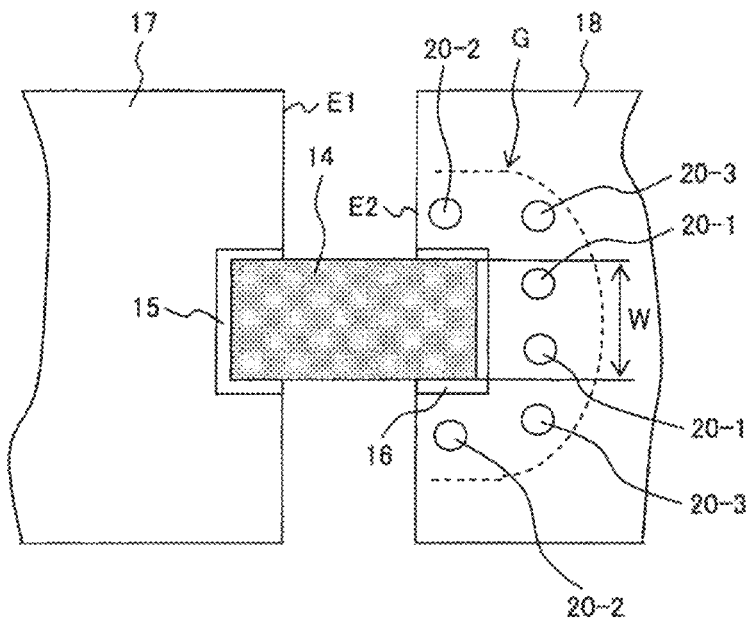
FIG. 3 shows an upper surface view of the wiring portion to which the wiring is bonded, with the electronic component mounted on the metal substrate, in a second preferred embodiment according to the present invention.

FIG. 3 shows the upper surface view representing the related wiring structure of the second preferred embodiment having the feature such that stress mitigation holes having predetermined number of inner peripheries in arc shapes are formed in the surroundings of the land sections. It should herein be noted that circular shaped stress mitigation holes have been proposed as the arc shaped stress mitigation holes but may be ellipse shaped stress mitigation holes. In summary, the influences due to current concentrations and stress concentrations may more be improved than the rectangular stress mitigation holes.

In FIG. 3, wirings, each being made of copper foil, are formed on the upper section of insulation coating layer 11 of metal substrate 10. Here, a first wiring 17 (a power supply side) and a second wiring 18 (a ground side) are formed. First wiring 17 and second wiring 18 are electrically connected together via chip capacitor 14. First wiring 17 and one of electrodes of chip capacitor 14 are bonded together at first land section 15 via solder 15A and second wiring 18 and the other electrode of chip capacitor 14 are bonded together at second land section 16 via solder 16A.

Predetermined number of stress mitigation holes 20-1, 20-2, 20-3 are formed in stress mitigation region G which is in the proximity of second land section 16 of second wiring 18. Two circular stress mitigation holes 20-1 disposed in a range of width W within stress mitigation region G of a line along which width W of chip capacitor 14 is extended, two circular stress mitigation holes 20-2 mounted so as to correspond to side surfaces of chip capacitor 14, and two circular stress mitigation regions 20-3 mounted so as to correspond to a terminal corner section of chip capacitor 14 and the terminal corner section of the fillet of solder 16A. A total of six stress mitigation holes 20-1, 20-2, 20-3 are formed and are arranged to enclose second land section 16 in a range of stress mitigation region G. In addition, first land section 15 and second land section 16 are arranged in the proximity of (approximately flush with) end surface E1 of first wiring 17 and end surface E2 of second wiring 18. In such a structure as described above, when the tensile stress is acted upon second land section 16 when the temperature becomes high, stress mitigation holes 20-1, 20-2, 20-3 are deformed along the direction of tensile stress. When stress mitigation holes 20-1, 20-2, 20-3 are deformed, the tensile stress acted upon second land section 16 is reduced. Hence, a large tensile stress is not acted upon solder 16A of second land section 16 and a risk of generating the cracks in solder 16A becomes reduced.

In such a structure as described above, when the tensile stress is acted upon second land section 16 when the temperature becomes high, stress mitigation holes 20-1, 20-2, 20-3 are deformed along the direction of tensile stress. When stress mitigation holes 20-1, 20-2, 20-3 are deformed, the tensile stress acted upon second land section 16 is reduced. Hence, a large tensile stress is not acted upon solder 16A of second land section 16 and there is less possibility of generating the cracks in solder 16A.

In addition, the same case occurs in a case where the compression stress is generated when the temperature is reduced. The compression stress is reduced with stress mitigation holes 20-1, 20-2, 20-3 deformed in the compression stress direction. Thus, a risk such that the cracks are generated in solder 16A becomes reduced. Hence, even if the heat cycle is caused to repeat the tensile stress and the compression stress to be acted upon solder 16A of second land section 16, the stress is reduced. Hence, as compared with the conventional one shown in FIG. 8, a degree of generating the cracks is remarkably reduced.

In addition, since the shapes of stress mitigation holes 20-1, 20-2, 20-3 are circular, the concentration of currents flowing through the wirings becomes reduced and the Increases in the inductances can be suppressed. Thus, in a case of use of the chip capacitors, the increase in the Inductances can be suppressed and an ill influence on the chip capacitors can be reduced. Furthermore, the concentration of stress on the stress mitigation holes can be suppressed so that a risk such that the cracks are generated even if the heat cycle over the long term is applied can be reduced. Thus, such a phenomenon that the resistance is increased due to the decrease in the passage areas of currents and, in a worst case, the wirings are broken can be avoided.

It should herein be noted that, in the same way as the first embodiment, the size of each stress mitigation hole is determined for at least one or more of stress mitigation holes 20-1 to be positioned within the range of width W within stress mitigation region G of the line to which width W of chip capacitor 14 is extended. Thus, the stress of a portion (or position) corresponding to width W of chip capacitor 14 acted upon solder 16A of second land section 16 can efficiently be reduced.

In addition, solder 16A is thin at end surface E2 side of wiring 18 at second land section 16 of a portion at which the terminal section of chip capacitor 14, as shown in FIG. 3, is mounted and the corner section of solder 16A at terminal E2 side of wiring 18 is easy to be a generation start point of the cracks. Hence, stress mitigation holes 20-2 are respectively formed at side surface sides of chip capacitor 14. Thus, the stress acted upon each of the side surfaces of chip capacitor 14 is reduced so that the progress quantity of the cracks generated in solder 16A can be reduced.

Furthermore, there is a tendency that the stress is easily concentrated onto the end surface corner section of chip capacitor 14 and the end surface corner section of the fillet of solder 16A which is an opposite side of end surface E2 of wiring 18. Hence, the stress mitigation holes 20-3 are arranged to be positioned in the proximity of these corner sections, in this embodiment.

Incidentally, four stress mitigation holes 20-1, 20-2, 20-3 are arranged over a straight line. In order to distribute the stress in more uniformity, it is effective to make the arranged positions of stress mitigation holes 20-3 nearer to the end surface corner sections of the fillet of solder 16A. In this case, mutual distances of six stress mitigation holes 20-1, 20-2, 20-3 are set to be approximately equal to one another. Thus, the stresses acted upon second land section 15 can approximately be made equal to each other.

In the same way as the first embodiment, it is necessary to form stress mitigation region G in the proximity of second land section 16. When the distance to second land section 16 is provided, the stress is acted upon solder 16A of second land section 16 without reduction of the stress generated in the wiring present between second land section 16 and stress mitigation region G. Hence, a sufficient stress mitigation effect can be obtained when the distance from the end surface of second land section 16 to a center of each stress mitigation hole 20-1, 20-2, 20-3 is shorter than width W of the line to which width W of chip capacitor 14 is extended. In summary, stress mitigation holes 20-1 through 20-3 may be arranged at positions at which the stress acted upon solder 16A can be allowed in terms of design.

In the above-described embodiment, stress mitigation region G is formed in second wiring 18 of second land section 16 side. In the same way as the first embodiment, it is of course that stress mitigation region G can be formed in first wiring 17 at the first land section 15 side in the same way as the first preferred embodiment.

Since, in the second embodiment, the circular stress mitigation holes are adopted, the concentration of current flowing through the wirings can be reduced and the increase in the inductances can be suppressed. In addition, since the concentration of the stress can be suppressed, the generation of the cracks due to the heat cycle is reduced and such a phenomenon as the increase in the resistance due to the reduction of the current passage area or the breakage of line between the wirings can be avoided.

Embodiment 3

Next, the wiring structure in a third preferred embodiment according to the present invention will be described. The third embodiment is the same as the second embodiment in a view such that the predetermined number of circular stress mitigation holes are formed in the surrounding of the land sections. The third embodiment is different from the second embodiment in that the stress mitigation holes are furthermore increased and this point is the feature of the third embodiment. It should herein be noted that the same reference numerals as those described in the second embodiment designate like corresponding elements (constituent components).

Figure 4:
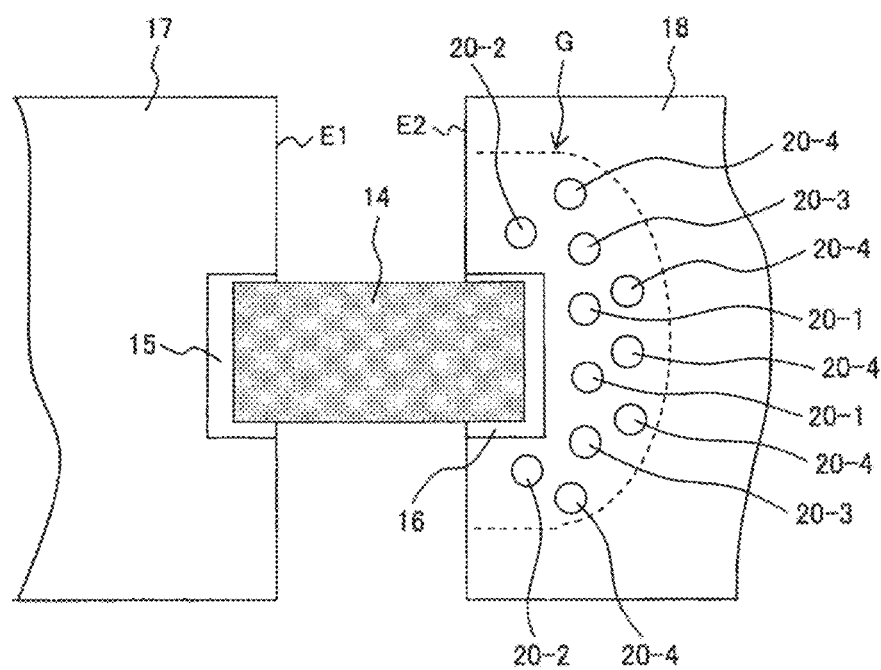
FIG. 4 shows an upper surface view of the wiring portion to which the wiring is bonded, with the electronic component mounted on the metal substrate, in a third preferred embodiment according to the present invention.

In FIG. 4, four stress mitigation holes 20-4 are newly added at the outside of stress mitigation holes 20-1, 20-2, 20-3 to form a double array structured stress mitigation holes. In addition, newly added stress mitigation holes 20-4 are formed at a direction side far away from end surface E2 of second wiring 18.

Since the stress generated in the wiring is acted from an opposite side of end surface E2, added stress mitigation holes 20-4 are formed at the direction side which becomes far away from end surface E2 of second wiring 18 and, thus, the stress generated in the corresponding wiring is efficiently reduced. The other actions and effects are the same as the second embodiment and, thus, the detailed description thereof will be omitted.

In the above-described embodiment, stress mitigation region G is formed in second wiring 18 at second land section 16 side. It goes without saying that stress mitigation region G can be formed in first wiring 17 of first land section 15 side in the same way as the first embodiment.

Embodiment 4

Next, the wiring structure in a fourth preferred embodiment according to the present invention will be explained. This fourth embodiment is the same as the second embodiment in the viewpoint of the formation of the predetermined number of circular stress mitigation holes in the surrounding of the land section(s). However, the fourth embodiment is different from the second embodiment in that the stress mitigation holes are arranged at a portion at which the stress is concentrated and at a portion at which the cracks are easy to be generated. This point provides the feature of the fourth embodiment. It should herein be noted that the same reference numerals as those in the second embodiment and in the third embodiment designate like corresponding constituent components (elements).

Figure 5:
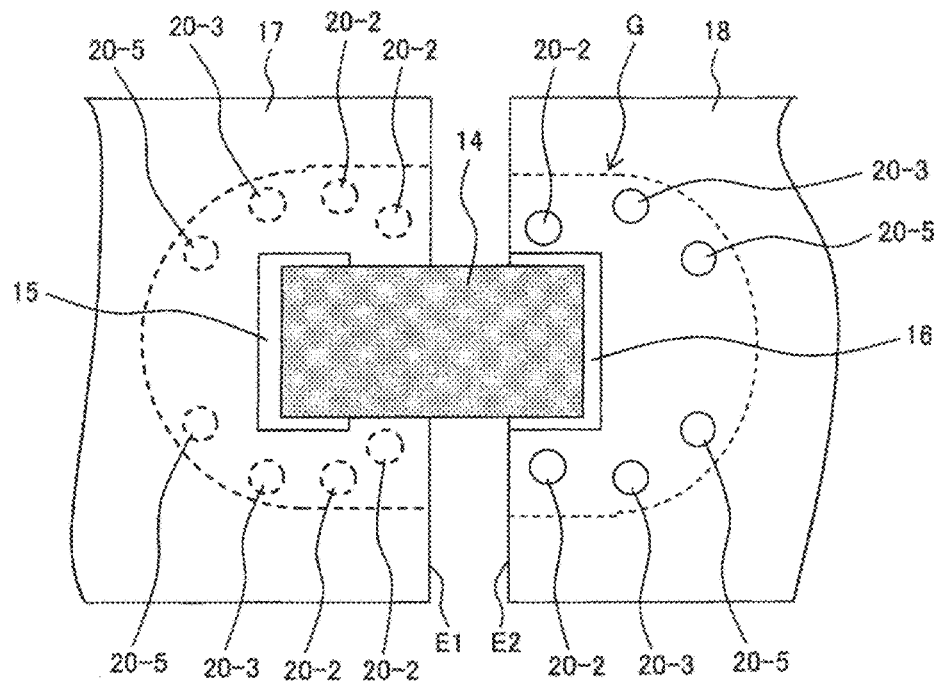
FIG. 5 shows an upper surface view of the wiring portion to which the wiring is bonded, with the electronic component mounted on the metal substrate, in a fourth preferred embodiment according to the present invention.

In FIG. 5, end surface E2 side of wiring 18 at second land section 16 of a portion on which chip capacitor 14 is mounted has a thin solder 16A and the corner section of solder 16A at end surface E2 side of wiring 18 become easy to be the generation start point of the cracks. Therefore, stress mitigation holes 20-2 are respectively formed at the side surface sides of chip capacitor 14. Thus, the stress acted upon the side surfaces of chip capacitor 14 is reduced and the progress quantity of the cracks generated in solder 16A can be reduced.

Furthermore, the stress has the tendency to be easy to be concentrated on the corner section of the end surface of chip capacitor 14 and on the corner section of the end surface of the fillet of solder 16A which is the opposite side to end surface E2 of wiring 18. Thus, in the fourth embodiment, stress mitigation holes 20-3 are disposed in the proximity of this corner section and at least another stress mitigation hole 20-5 is disposed in the proximity of each corresponding stress mitigation hole 20-3. Stress mitigation holes 20-3 and stress mitigation holes 20-5 are formed at positions to enclose the end surface corner sections of chip capacitor 14 and end surface corner sections of the fillet of solder 16A. Hence, the stress concentrated on the corner sections of the end surfaces of chip capacitor 14 and the end surface corner section of the fillet of solder 14 can efficiently be reduced.

According to the fourth embodiment, the stress mitigation holes are disposed only at the portion onto which the stress is concentrated and at the portion at which the cracks are easy to be generated. Hence, a strength of the wiring cannot significantly be damaged. In addition, since the stress mitigation holes are not disposed more than necessary, the passage area of the currents can sufficiently be obtained but the increases of the inductance and the resistance can be suppressed. The other actions and effects are the same as the second embodiment and the detailed explanations thereof will herein be omitted.

In the fourth embodiment, stress mitigation region G is formed in second wiring 18 at second land section 16 side. It goes without saying that stress mitigation region G can be formed in first wiring 17 at first land section 15 side in the same way as the first embodiment.

It should be noted that, in a case where the position at which the land section is formed is not such a position as second land section 16, the arrangement positions of the stress mitigation holes are different. In a case where, as first land section 15, the land position is positioned at a more depth direction side than end surface E1 of first wiring 15, the certain distance between first land section 15 and end surface E1 of first wiring 17 is provided so that the end surface corner sections of first land section 15 are positioned at these portions. Thus, the stress is concentrated onto these portions.

Thus, in the fourth embodiment, two stress mitigation holes 20-2 which have been arranged at side surface sides of chip capacitor 14 are added and are disposed so as to make nearer to end surface E1 side of first wiring 17. Hence, two stress mitigation holes 20-2 are arranged to enclose the surface corner sections of first land section 15 of end surface E1 side of first wiring 15. Thus, the stress concentrated on the end surface corner sections of chip capacitor 14 and the end surface corner sections of the fillet of solder 16A can effectively be reduced.

Embodiment 5

Next, the wiring structure in a fifth preferred embodiment according to the present invention will be explained. The fifth embodiment is the same as the second embodiment in the viewpoint of the formation of the predetermined number of circular stress mitigation holes in the surrounding of each of land sections. The fifth embodiment is, however, different from the second embodiment in that a minimum number of stress mitigation holes are arranged at the portion onto which the stress is concentrated and at the portion at which the cracks are easy to be generated and two stress mitigation holes are reduced as compared with the fourth embodiment. It should, herein, be noted that the same reference numerals as those in the fourth embodiment designate the like corresponding elements (constituent components).

Figure 6:
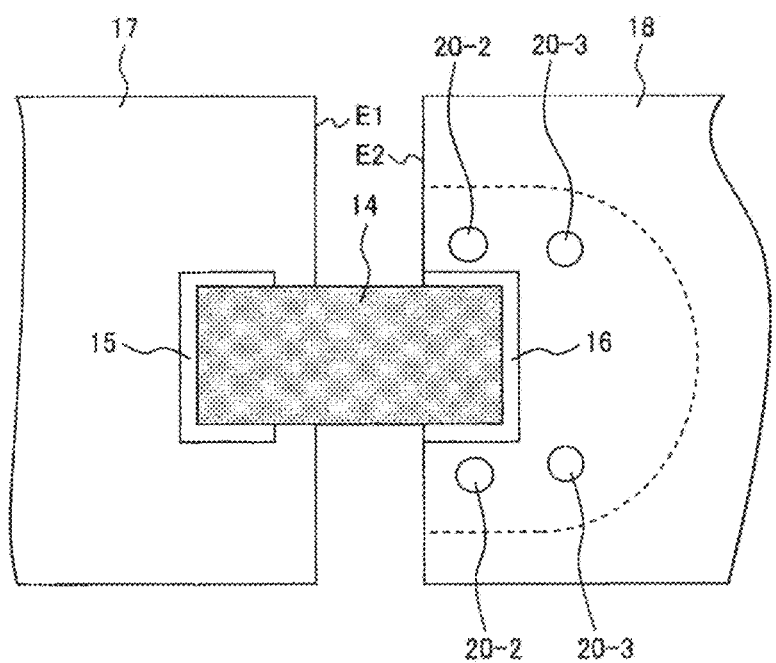
FIG. 6 shows an upper surface view of the wiring portion to which the wiring is bonded, with the electronic component mounted on the metal substrate, in a fifth preferred embodiment according to the present invention.

In FIG. 6, end surface E2 side of wiring 18 at second land section 16 of the position on which one terminal of chip capacitor 14 is mounted has thin solder 16A and the corner section of solder 16A at end surface E2 side of wiring 18 becomes easy to be the generation start point of cracks. Hence, stress mitigation holes 20-3 are disposed in the proximity of the corner section of the end surface of the fillet of solder 16A and the end surface corner section of chip capacitor 14.

Consequently, the stress acted upon the side surfaces of chip capacitor 14 are reduced so that the progress quantity of the cracks generated in solder 16A can be reduced.

Furthermore, the stress has the tendency to be easy to be concentrated onto the end surface corner section of chip capacitor 14 and the end surface corner section of the fillet of solder 16A which are opposite side to end surface E2 of wiring 18. Hence, stress mitigation holes 20-3 are disposed in the proximity of these corner sections, in the fifth embodiment. Since stress mitigation holes 20-3 are disposed in the proximity of end surface corner section of chip capacitor 14 and the end surface corner section of the fillet of solder 16A, the stress concentrated onto the end surface corner section of chip capacitor 14 and the end surface corner section of the fillet of solder 16A can effectively be reduced.

Since, according to the fifth embodiment, the stress mitigation holes are disposed only at portions onto which the stress is concentrated and at which the cracks are easy to be generated, the strength of the wiring cannot largely be damaged. In addition, since the stress mitigation holes are not disposed with a number of the holes more than necessary, the passage area of current can sufficiently be obtained and the increase in the electrical resistance can be suppressed. Since the other actions and effects than the above-described effects are the same as those of the second embodiment, the detailed description of these will herein be omitted.

The above-described explanations of the fifth embodiment are the formation of stress mitigation region G in second wiring 18 of second land section 16 side. In the same way as the first embodiment, it goes without saying that stress mitigation region G can be formed in first wiring 17 of first land section 15.

Next, a modification of the fifth embodiment will be explained on a basis of FIG. 7. In this modification in FIG. 7, an area of each stress mitigation hole 20-2A formed at each side surface side of chip capacitor 14 is made smaller than the area of each stress mitigation hole 20-3 formed in the proximity of the end surface corner section of chip capacitor 14 and the end surface corner section of the fillet of solder 16A. This is a difference point of the modification from the embodiment shown in FIG. 6.

Figure 7:
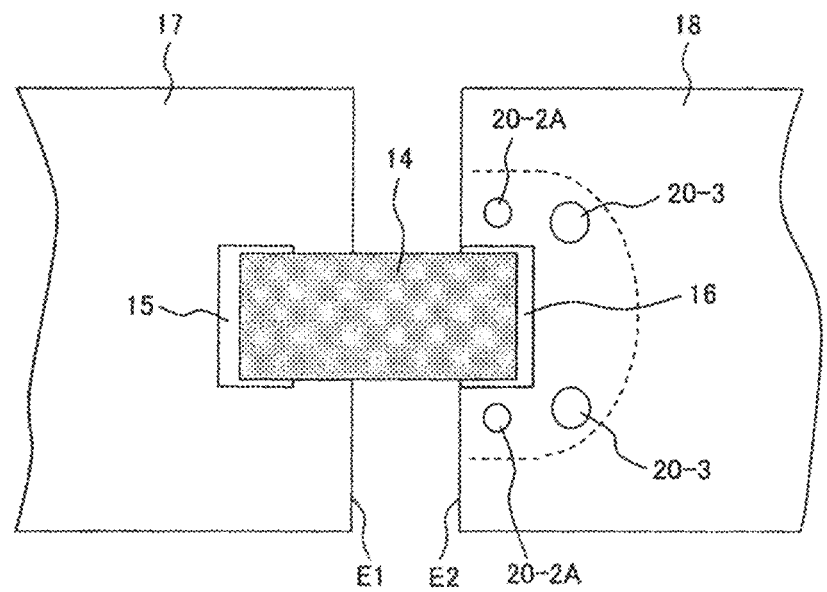
FIG. 7 shows an upper surface view of the wiring portion to which the wiring is bonded, with the electronic component mounted on the metal substrate, in a modification of the fifth preferred embodiment according to the present invention.

In FIG. 7, stress mitigation holes 20-2A, each having a smaller diameter than each of stress mitigation holes 20-3, are formed at the side surface sides of chip capacitor 14, respectively. Thus, the stress acted upon the side surfaces of chip capacitor 14 is reduced and a risk such that the cracks are generated in thin solder 16A is reduced. In addition, another reason that the diameter of each stress mitigation hole 20-2A will be described as follows:

An object of providing chip capacitor 14 in terms of a circuit element is the reduction of an Impedance between wiring 17 and wiring 18. A major current component of a current flowing through wiring 18 flows through a center axis in a width direction of chip capacitor 14.

Therefore, since the side surfaces of chip capacitor 14 have relatively small currents, a degree of influence of a wiring inductance of the side surfaces of chip capacitor onto the currents is smaller than a center axis portion of chip capacitor 14. Hence, the diameter of each stress mitigation hole viewed from the upper surface of the circuit board (substrate) can be determined freely.

In this way, the reduction effect of the stress is secured even when the diameter of each stress mitigation hole is made smaller to match with the wiring width of the side positioned at one of the side surfaces of chip capacitor and, since the diameter thereof is made small to match with the wiring width, an occupation rate of each stress mitigation hole 20-2A within the wiring width occupying a space between each of side surface sides of chip capacitor 14 and each of side surface sides of second wiring 18 becomes small and a sufficient current passage area can be maintained.

On the other hand, the diameter of one of stress mitigation holes 20-3 at the side positioned at an elongate direction side of chip capacitor 14 is made large so as to Increase a reduction rate of the stress. In addition, since the occupation rate within the wiring of one of stress mitigation holes 20-2A in the elongate direction of the wiring is not so large even if the diameter thereof is made large, the sufficient current passage area can be maintained.

In the above-described embodiments, as the electronic component under the surface mounting, the chip capacitor is exemplified. In this addition, the chip resistor or an FET which is a semiconductor element may be mounted.

As described hereinabove, according to the present invention, the stress mitigation region in which the predetermined number of stress mitigation holes penetrating through the wiring are disposed is formed in the proximity of the bonding portion of the electronic component to which the electronic component is bonded to the wiring via the electrically conductive bonding agent. Thus, even if the stress (thermal stress) is generated in the wiring due to the heat, the stress mitigation holes are deformed so that the stress acted upon the electrically conductive bonding agent becomes small. Consequently, the generation of the cracks in the electrically conductive bonding agent can be suppressed.

It should be noted that the present invention is not limited to the above-described preferred embodiments and various modifications are included. For example, the above-described embodiments have been explained in order to facilitate a better understanding the present Invention and the present invention is not always limited to the structure in which all constituent elements which have been explained are equipped. In addition, it is possible to replace a part of the structure in a certain embodiment with the structure of another embodiment and, in addition, it is also possible to add the structure of the certain embodiment to the structure of another embodiment. Furthermore, it is possible to add, delete, and replace another structure for a part of the structure of each preferred embodiment.

The invention claimed is:

1. An electronic control device, comprising:
   at least a metal substrate;
   at least a wiring formed on the metal substrate;
   at least an electronic component bonded to a part of the wiring via an electrically conductive bonding agent; and
   a stress mitigation region in which a predetermined number of stress mitigation holes penetrating through the wiring are disposed and which is formed in a portion of the wiring which is in a proximity of a bonding portion of the electronic component via which the electronic component is bonded to the wiring, the plurality of stress mitigation holes in the stress mitigation region being structured to deform due to generation of thermal stress in the wiring to reduce the stress acted upon the electrically conductive bonding agent.

2. The electronic control device as claimed in claim 1, wherein a width of the wiring is at least twice as large as a width of the electronic component bonded to the wiring, a land section on which the electrically conductive bonding agent is arranged is formed on an end surface of the wiring, and the predetermined number of stress mitigation holes are arranged so as to surround at least part of the land section.

3. The electronic control device as claimed in claim 2, wherein the predetermined number of stress mitigation holes include at least one or more stress mitigation holes disposed in at least one of a proximity of one side surface of the electronic component, in a proximity of a corner section of the electronic component, or in a proximity of a corner section of a fillet of an electrically conductive layer.

4. The electronic control device as claimed in claim 3, wherein the predetermined number of stress mitigation holes include at least one or more stress mitigation holes in a range of a width within the stress mitigation region of a line to which the electronic component is extended.

5. The electronic control device as claimed in claim 2, wherein a distance between a center of at least one of the predetermined number of stress mitigation holes and an end surface of the land section is smaller than a width of a line within the stress mitigation region to which the electronic component is extended.

6. The electronic control device as claimed in claim 1, wherein a shape of each stress mitigation hole is a rectangular shape or an arc shape.

7. The electronic control device as claimed in claim 6, wherein the arc shaped stress mitigation holes are circular stress mitigation holes.

8. An electronic control device, comprising:
   at least a metal substrate;
   at least a wiring formed on the metal substrate; and
   at least a chip capacitor bonded to a part of the wiring with an electrically conductive bonding agent,
   wherein a width of the wiring is at least twice as large as a width of the chip capacitor bonded to the wiring, a land section on which the electrically conductive bonding agent is arranged is formed on an end surface of the wiring, and a predetermined number of circular stress mitigation holes are arranged in a surrounding of the land section, the circular stress mitigation holes being structured to deform due to generation of thermal stress in the wiring to reduce the stress acted upon the electrically conductive bonding agent.

9. The electronic control device as claimed in claim 8, wherein the wiring to which the chip capacitor is connected comprises a power supply wiring and a ground wiring, and the predetermined number of circular stress mitigation holes are arranged in the surrounding of the land section of either one or both of the power supply wiring and the ground wiring.

10. The electronic control device as claimed in claim 9, wherein the predetermined number of stress mitigation holes include at least one or more stress mitigation holes disposed at least in a proximity of one side surface of the chip capacitor, in a proximity of a corner section of the chip capacitor, or in a proximity of a corner section of a fillet of the electrically conductive bonding agent.

11. The electronic control device as claimed in claim 10, wherein an area of at least one of the predetermined number of stress mitigation holes in the proximity of the corner section of the chip capacitor or in the proximity of the corner section of the fillet of the electrically conductive bonding agent is larger than an area of at least another of the predetermined number of stress mitigation holes in the proximity of the one side surface of the chip capacitor.

* * * * *